(12) United States Patent
Tai (10) Patent No.: US 7,965,142 B2
(45) Date of Patent: Jun. 21, 2011

(54) GAIN CONTROL CIRCUIT AND ITS GAIN CONTROL METHOD

(75) Inventor: Jy-Der David Tai, Sanchong (TW)

(73) Assignee: Tai-1 Microelectronics Corp., Taipei County (TW)

( * ) Notice: Subject to any disclaimer, the term of this patent is extended or adjusted under 35 U.S.C. 154(b) by 0 days.

(21) Appl. No.: 12/588,873

(22) Filed: Oct. 30, 2009

(65) Prior Publication Data
US 2011/0057729 A1    Mar. 10, 2011

(30) Foreign Application Priority Data

Sep. 8, 2009   (TW) ................................ 98130186 A (51) Int. Cl.
*H03G 3/20*   (2006.01)
(52) U.S. Cl. ........................................ 330/279; 330/140
(58) Field of Classification Search .................. 330/140, 330/279; 381/104
See application file for complete search history.

(56) References Cited

U.S. PATENT DOCUMENTS 4,992,753 A * 2/1991 Jenson et al. ................. 330/129
5,416,441 A * 5/1995 Nagano ......................... 330/129
5,642,075 A * 6/1997 Bell .............................. 330/129

* cited by examiner

*Primary Examiner* — Steven J Mottola
(74) *Attorney, Agent, or Firm* — Rosenberg, Klein & Lee (57) ABSTRACT

A gain control circuit and its gain control method, said gain control method comprising the following steps: firstly, outputting continuously a counter value; next, generating a ramp wave signal based on said counter value, and at a voltage where a control voltage signal intersects said ramp wave signal, obtaining an initial counter value based on said ramp wave signal, thus determining an initial voltage gain of an amplifier circuit; then, when a high or low voltage of an output signal of said amplifier circuit is greater or less than a predetermined detection voltage upper or lower limit, adjusting a DC voltage level of said ramp wave signal with a detection signal; and finally, obtaining at said voltage a counter value less than said initial counter value based on said ramp wave signal, hereby reducing said initial voltage gain based on said counter value.

19 Claims, 11 Drawing Sheets

GAIN CONTROL CIRCUIT AND ITS GAIN CONTROL METHOD

BACKGROUND OF THE INVENTION

1. Field of the Invention

The present invention relates to a control technology, and in particular to a gain control circuit and its gain control method.

2. The Prior Arts

In general, an analog type electronic gain control circuit is achieved through a Golbert cell. The basic conversion characteristic of Gilbert cell is Y=kX, wherein, Y is an output signal voltage, X is an input signal voltage, and k is a constant. From the above equation it is evident that, its amplification factor or voltage gain can be set at Y/X, and Y/X=k. Therefore, k is the voltage gain of output signal voltage Y relative to input signal voltage X.

Figure 1:
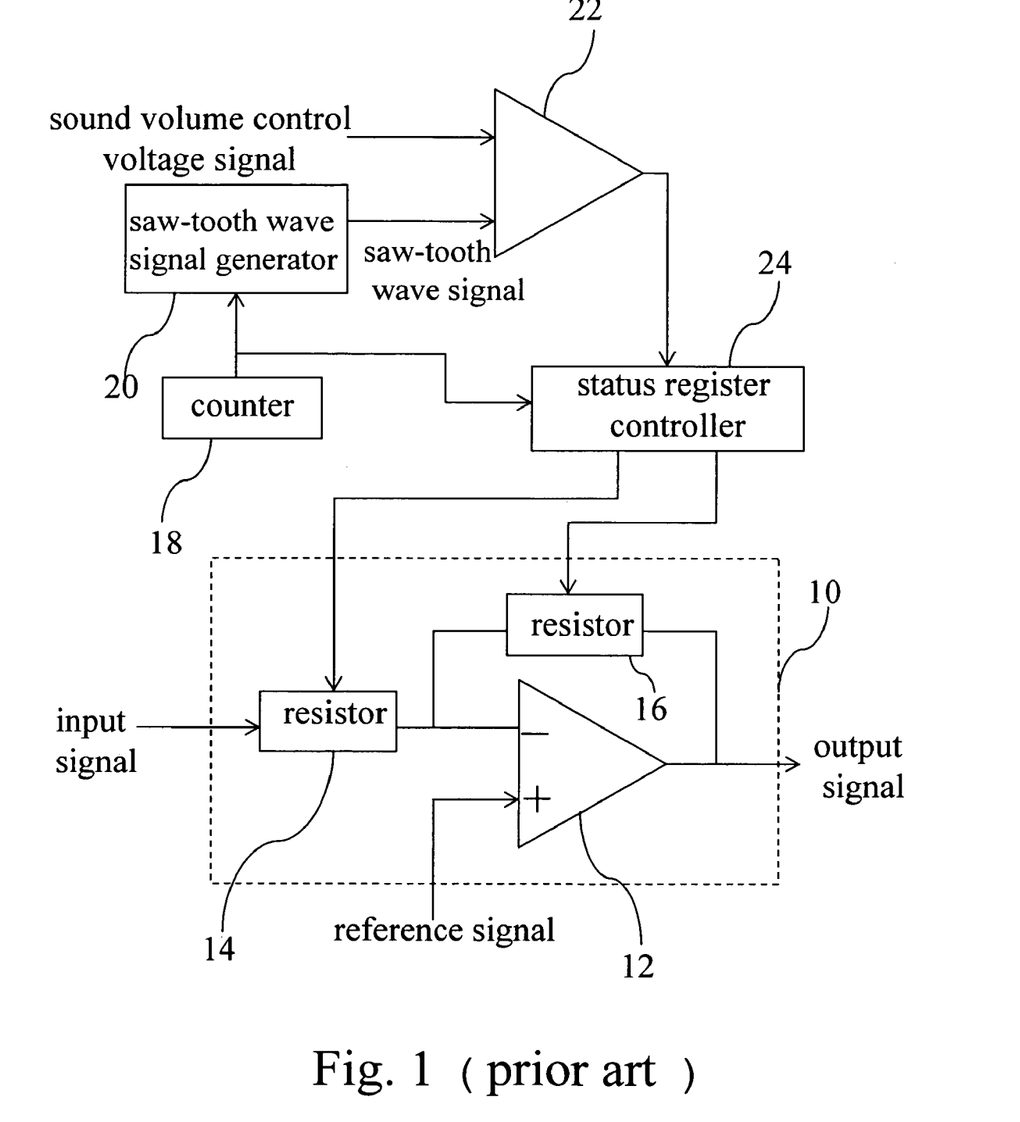
FIG. 1 is a circuit diagram of a digital type electronic gain control circuit according to the prior art.
Figure 2A:
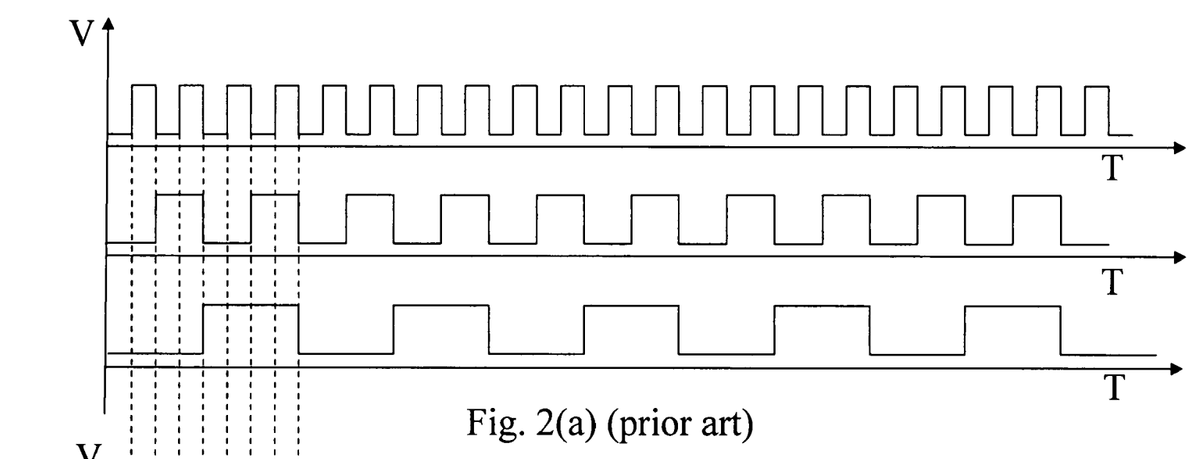
FIGS. 2(a) to 2(c) are the waveform diagrams of output signal of a counter, sound volume control voltage signal and positive slope saw-tooth wave signal, and its corresponding latch-up signal respectively according to the prior art.
Figure 2B:
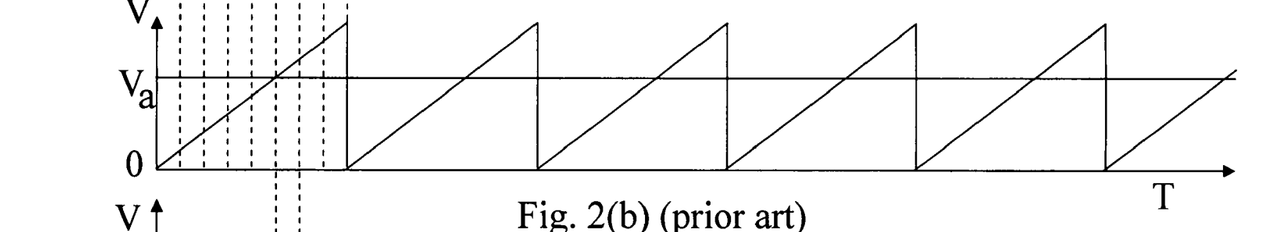
Figure 2C:
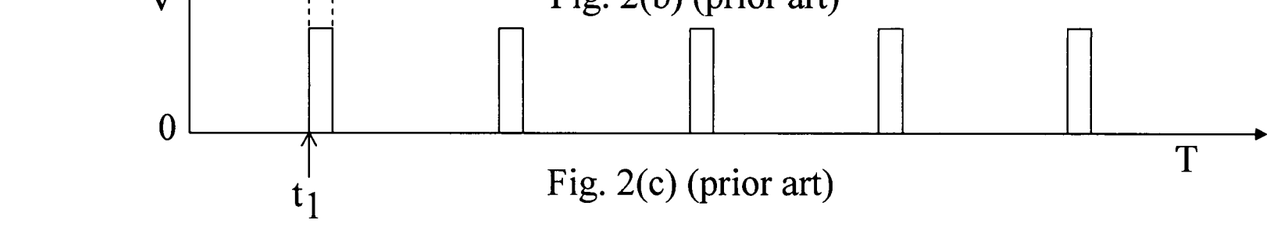

In the following descriptions, refer to FIG. 1 & FIGS. 2(a) to 2(c) simultaneously. Compared with an analog type electronic gain control circuit, a digital type electronic gain control circuit has a wider dynamic operation range and more accurate control relative to an audio amplifier circuit 10. Wherein, FIG. 2(a) is a waveform diagram of output signals of a counter 18; FIG. 2(b) shows waveform diagrams of sound volume control voltage signal and saw-tooth wave signal generated by a saw-tooth wave signal generator 20, and the saw-tooth wave signal is generated based on a counter value output by the counter 18; and FIG. 2(c) is a waveform diagram of latch-up signals output by a comparator 22. The basic operation principle of a digital type electronic gain control circuit is that, a comparator 22 is used to compare a sound volume control voltage signal with a saw-tooth wave signal, when the voltage of the sound volume control voltage signal is equal to that of saw-tooth wave signal, the comparator 22 outputs a latch-up signal to a status register controller 24, so as to latch-up the contents of counter 18. The contents of the counter 18 are used to control the resistances of resistors 14 and 16 in an audio amplifier circuit 10, hereby determining the voltage gain of the amplifier circuit 10. However, under a specific voltage gain, in case that the voltage of an input signal of an amplifier circuit 10 is overly large, then the voltage of the signal output by the amplifier circuit 10 may exceeds a rated voltage, thus creating serious distortion. In other words, in this situation, the maximum voltage of output signal is restricted at a power supply voltage, and its minimum voltage of output signal is restricted at a ground voltage.

In view of the problems and shortcomings of the prior art, the present invention proposes a gain control circuit and its gain control method, so as to solve the problem of the prior art.

SUMMARY OF THE INVENTION

A major objective of the present invention is to provide a gain control circuit and its gain control method, that is realized through adjusting a ramp wave signal DC voltage level, such that not only the output signal distortion of audio amplifier circuit can be prevented, but the magnitude of output signal of an audio amplifier circuit can also be restricted, thus protecting a loudspeaker or human ears from being damaged.

In order to achieve the above mentioned objective, the present invention provides a gain control circuit connected to an amplifier circuit, and that is used to output an output signal, comprising: a processor, a ramp wave signal generator, a counter, a voltage detector, and a DC voltage level regulator. Wherein, the counter is used to output a counter value continuously, and is connected to a ramp wave signal generator; the ramp wave signal generator outputs a ramp wave signal based on the counter value, and when the ramp wave signal generator is a trigonometric wave signal generator or a saw-tooth wave signal generator, then the ramp wave signal output by the ramp wave signal generator is a trigonometric wave signal or a saw-tooth wave signal. The amplifier circuit and the counter are connected respectively to a processor. The processor receives the ramp wave signal and a control voltage signal, and obtains from the counter a counter value corresponding to the ramp wave signal as the first counter value and stores it temporarily, at a voltage that the control voltage signal intersects the ramp wave signal, and determines the magnitude of voltage gain of an amplifier circuit based on the first counter value. In addition, a voltage detector is provided, which presets detection voltage upper and lower limits, receives an output signal, and outputs a detector signal when the high voltage of the output signal is greater than the detection voltage upper limit or when the low voltage of the output signal is less than the detection voltage lower limit. The ramp wave signal generator and the voltage detector are connected respectively to a DC voltage level regulator, that is used to receive a detection signal to regulate the DC voltage level of a ramp wave signal, such that the counter value obtained by the processor from the counter is corresponding to the ramp wave signal and less than the first counter value, and that serves as a second counter value in updating the first counter value, hereby reducing the voltage gain of the amplifier circuit by using the second counter value.

Furthermore, the present invention provides a gain control method, wherein, an output signal output by an amplifier circuit is received and is used to control the magnitude of voltage gain of the amplifier circuit, comprising the following steps: firstly, outputting continuously a counter value by a counter; next, generating a ramp wave signal by a ramp wave signal generator based on the counter value; then, receiving by a processor the ramp wave signal and a control voltage signal, and at a voltage of the control voltage signal intersecting the ramp wave signal, obtaining from the counter a counter value corresponding to the ramp wave signal as the first counter value and storing it temporarily, and determining an initial voltage gain of the amplifier circuit based on the first counter value; subsequently, upon determining the initial voltage gain, in case that the high voltage of an output signal is greater than a preset detection voltage upper limit or in case that the low voltage of an output signal is less than a preset detection voltage lower limit, then outputting a detection signal by a voltage detector, and upon receiving the detection voltage by a DC voltage level regulator, regulating the DC voltage level of the ramp wave signal; and finally, receiving by the processor from the counter the counter value, that is corresponding to the ramp wave signal and less than the first counter value, and that serves as a second counter value in updating the first counter value, as such reducing the initial voltage gain of the amplifier circuit by using the second counter value.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

In the present invention, a gain control circuit is connected to an amplifier circuit, and is used to receive a control voltage signal to determine the magnitude of voltage gain of the amplifier circuit. In the following descriptions, a sound volume control voltage signal and an audio amplifier circuit are taken as examples respectively for the control voltage signal and the amplifier circuit in explaining the circuit structure and its operation of the present invention.

Figure 3:
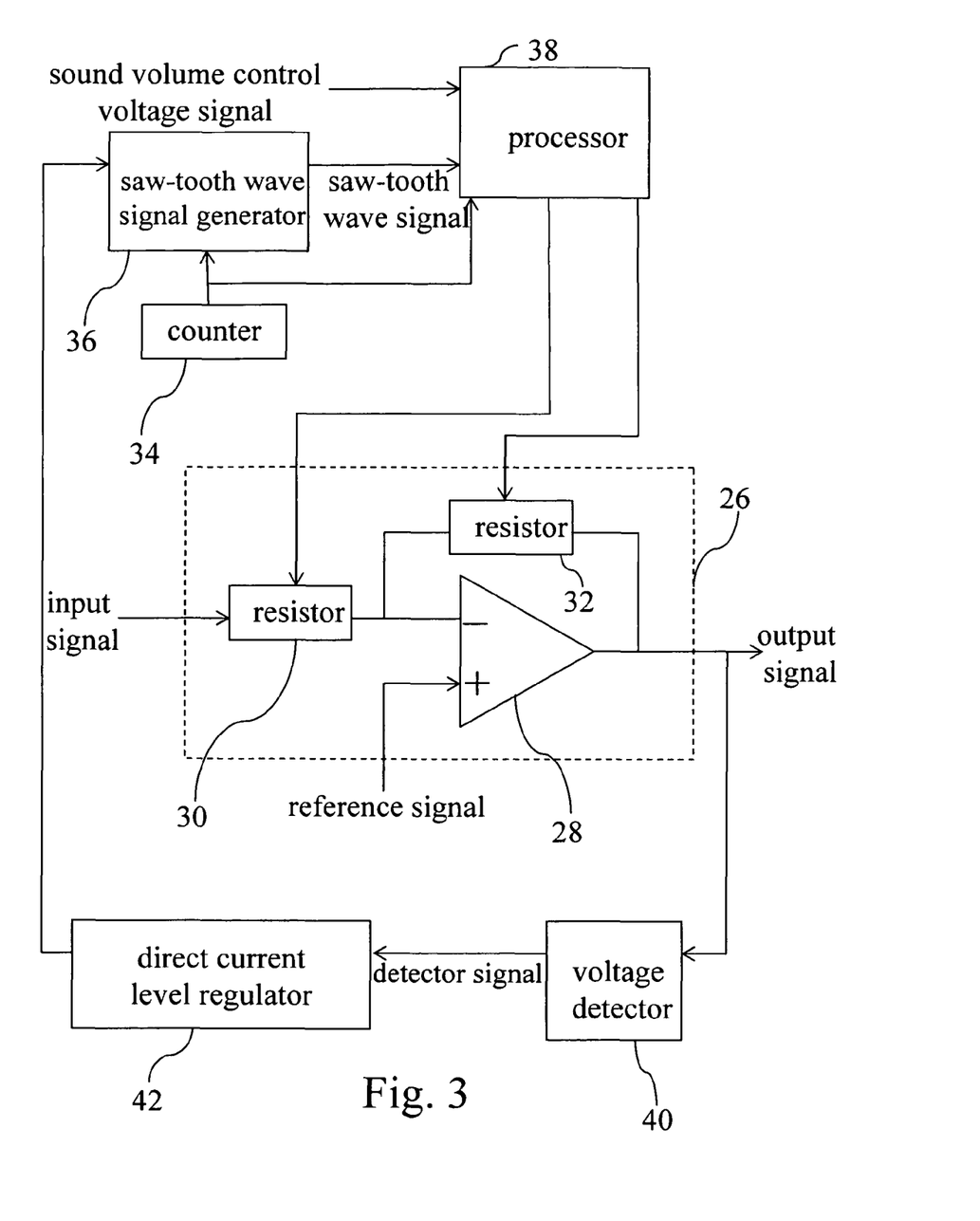
FIG. 3 is a circuit diagram of a gain control circuit according to a first embodiment of the present invention.
Figure 4A:
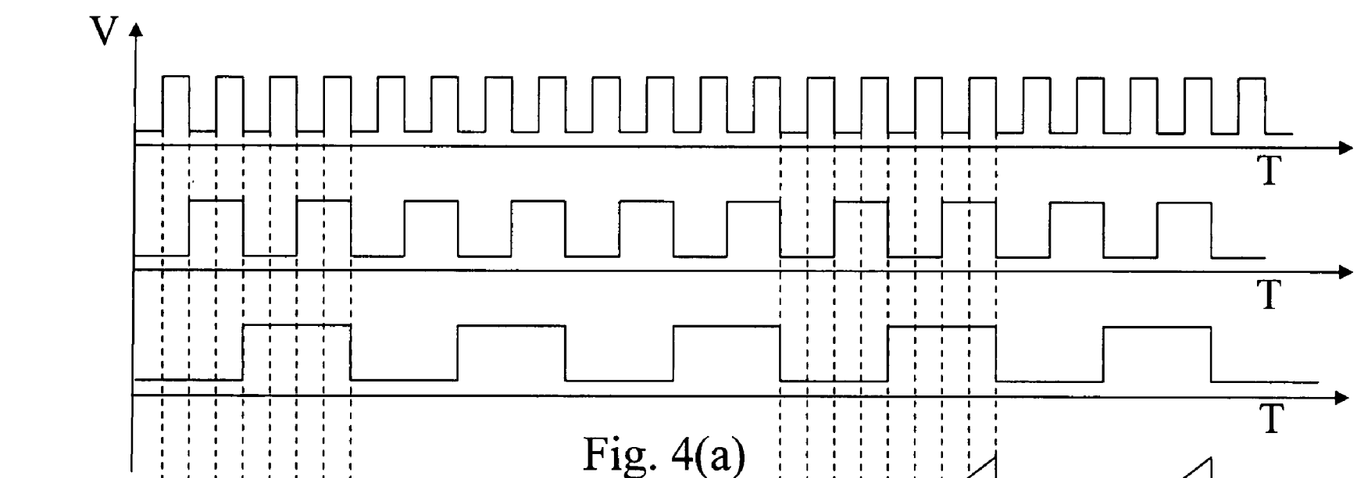
FIGS. 4(a) and 4(b) are the waveform diagrams of output signal of a counter; sound volume control voltage signal and positive slope saw-tooth wave signal according to an embodiment of the present invention.
Figure 4B:
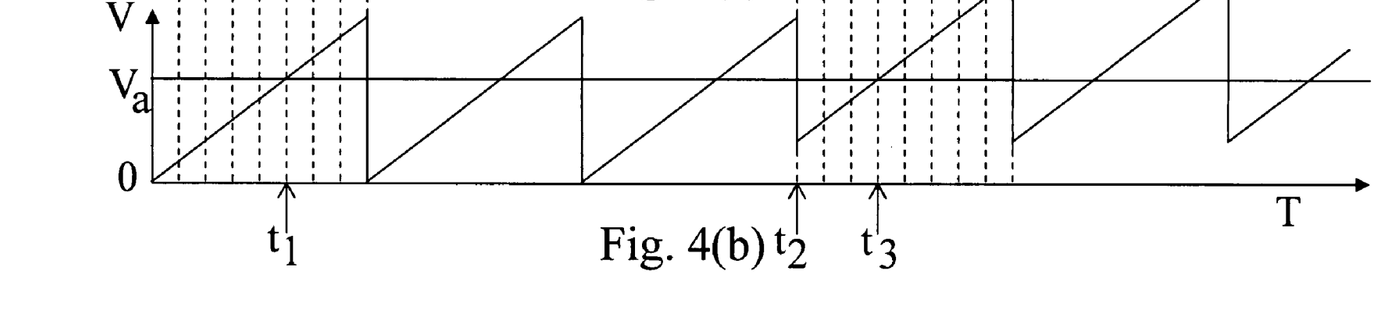

Refer to FIG. 3, FIGS. 4(a) and 4(b) simultaneously. Wherein, FIG. 3 is a circuit diagram of a gain control circuit according to a first embodiment of the present invention; FIG. 4(a) is the waveform diagram of the output signal of a counter; and FIG. 4(b) shows the waveform diagrams of sound volume control voltage signal and positive slope saw-tooth wave signal according to an embodiment of the present invention. In the present invention, the gain control circuit is connected to an audio amplifier circuit 26, such that the audio amplifier circuit 26 includes an amplifier 28, a resistor 30, a resistor 32. The positive input terminal of the amplifier 28 is used to receive a reference signal, with its negative terminal connected to a resistor 30 and a resistor 32, and is used to receive an input signal. The output terminal of the amplifier 28 is connected to a resistor 32, such that the input signal is amplified by the amplifier 28, and then is output from an output terminal of the amplifier 28. Since the resistances of resistors 30 and 32 are $R_i$ and $R_f$ respectively, therefore, the voltage gain of amplifier circuit 26 is $-(R_f/R_i)$.

In the present invention, a ring counter 34 serving as a counter, and a ramp wave signal generator connected thereto are provided. The ramp wave signal generator generates ramp wave signals based on the counter values continuously output by the ring counter 34. The ramp wave signal generator can be a saw-tooth wave signal generator or a trigonometric wave signal generator, and is used to generate saw-tooth wave signals or trigonometric wave signals respectively. In the present embodiment, for the ramp wave signal generator, a saw-tooth wave signal generator 36 is taken as an example. Since the counter value output by the ring counter 34 is of a periodic nature, therefore the period of saw-tooth wave signals is the same as that of the counter value. In the present embodiment, the period of the counter values output by the ring counter 34 is composed of 8 cycles, with the eight corresponding counter values sequentially as 000,001,010,011, 100,101,110,111, and then the ninth counter value will start from 000 again, and the voltage of a saw-tooth wave signal will be increased or decreased a fixed and specific value upon each jump of counter value. As such, upon the output of the ninth counter value, the voltage of a saw-tooth wave signal will return to its original value corresponding to counter value 000. In other words, each of the voltage values of the saw-tooth wave signals corresponds to a counter value, and the slope of saw-tooth wave signal can be positive or negative.

The saw-tooth wave signal generator 36 and the resistors 30 and 32 of an amplifier circuit 26 are connected to a processor 38 respectively. The processor 38 receives a saw-tooth wave signal and a sound volume control voltage signal of analog signal, and when the sound volume control voltage signal is intersected with a saw-tooth wave signal, the processor 38 obtains from the counter 34 a counter value corresponding to the saw-tooth wave signal to serve as a first counter value and stores it temporarily, and determines the resistances of resistors 30 and 32 based on the first counter value, hereby determining the voltage gain of the amplifier circuit 26.

The output terminal of the amplifier circuit 26 is connected to a voltage detector 40, that is designed to provide the detection voltage upper and lower limits, and is used to receive the output signal of the amplifier circuit, and it outputs a detection signal, when the high voltage of this output signal is greater than the detection voltage upper limit or the low voltage of this output signal is lower than the detection voltage lower limit. The voltage detector 40 is connected to a saw-tooth wave signal generator 36 through a direct current (DC) level regulator 42. The direct current (DC) level regulator 42 is used to receive the detection signal, and raise or lower the direct current voltage level of the ramp wave signal, so that the counter value corresponding to a ramp wave signal as obtained by the processor 38 from the counter 34 is less than the first counter value, and this counter value serves as the second counter value in updating the first counter value, hereby reducing the voltage gain of the amplifier circuit 26 by utilizing this second counter value.

Figure 5:
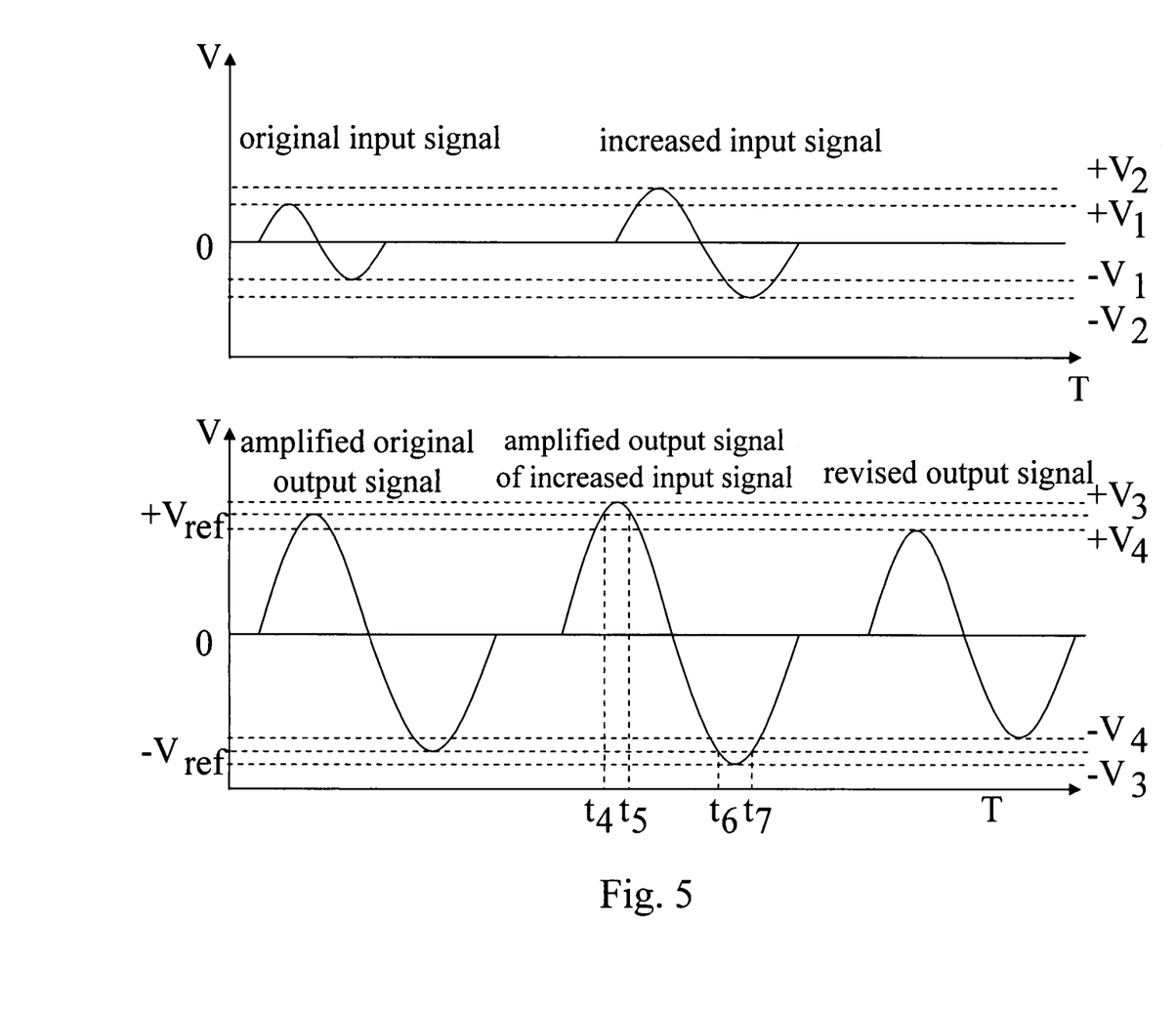
FIG. 5 is a waveform diagram of the input signal and output signal of an amplifier circuit according to a first embodiment of the present invention.

Refer to FIGS. 4(b) & 5 simultaneously for waveform diagrams of sound volume control voltage signal and positive slope saw-tooth wave signal according to an embodiment of the present invention; and a waveform diagram of the input signal and output signal of an amplifier circuit according to a first embodiment of the present invention respectively. In the following, the first embodiment of the present invention will be described in detail, and a positive slope saw-tooth wave signal is taken as example for explanation. As shown in FIG. 4(b), before a time point $t_2$, a sound volume control voltage signal is intersected with a saw-tooth wave signal at a voltage $V_a$, that corresponds to a time point $t_1$ in the first periodic waveform of the saw-tooth wave signal, therefore, at this time point, the processor 38 will obtain from the counter 34 a counter value 100, that corresponds to the voltage value $V_a$ of a saw-tooth wave signal and serves as the first counter value and is stored in processor 38 temporarily, thus determining the resistances of resistors 30 and 32, and the initial voltage gain of the amplifier circuit 26. Since in every period of a saw-tooth wave signal, the saw-tooth wave signal and sound volume control voltage signal will intersect once, thus in every period of a saw-tooth wave signal, the operation for determining the voltage gain of an amplifier circuit is performed once. Also, before the time point $t_2$, the counter value corresponding to the intersected voltage point of a saw-tooth wave signal and a sound volume control voltage signal is always 100, therefore, the voltage gain of the amplifier circuit 26 remains unchanged.

In other words, before time point $t_2$, an amplifier circuit 26 receives an original input signal having its high and low voltage at $+V_1$ and $-V_1$ respectively, thus the amplifier circuit 26 will output an original output signal according to an initial voltage gain. In this example, the high and low voltages of the original output signal are equal to the detection voltage upper limit $+V_{ref}$ and low limit $-V_{ref}$ of the voltage detector 40 respectively.

After time point $t_2$, the original input signal is increased, thus the amplifier circuit 26 receives an increased input signal with its high and low voltage at $+V_2$ and $-V_2$ respectively, wherein, $+V_2$ is greater than $+V_1$, and $-V_2$ is less than $-V_1$. In case that at this time, the initial voltage gain of the amplifier circuit 26 remains unchanged, then the amplifier circuit 26 will output an amplified output signal having its high and low voltages at $+V_3$ and $-V_3$ respectively, wherein, $+V_3$ is greater than $+V_{ref}$, and $-V_3$ is less than $-V_{ref}$. Therefore, voltage detector 40 will output a detection signal to a DC level regulator 42, so as to control the DC level regulator 42 in raising the DC voltage level of a saw-tooth wave signal.

For the raised saw-tooth wave signal as viewed from the waveform diagram, the intersected voltage point of a saw-tooth wave signal and a sound volume control voltage signal is located at a lower position of a saw-tooth wave signal. As such, after time point $t_2$, this intersected voltage point corresponds to a time point $t_3$ in the first periodic waveform of the saw-tooth wave signal after time point $t_2$. Therefore, at this time, the processor 38 will obtain from counter 34 a counter value 010, which corresponds to the voltage $V_a$ of saw-tooth wave signal and is less than the first counter value, and that serves as the second counter value in updating the first counter value, hereby reducing the initial voltage gain of the amplifier circuit 26 through varying the resistances of the resistors 30 and 32 by utilizing the second counter value.

Since the voltage gain of the amplifier circuit 26 is reduced, therefore, the amplifier circuit 26 will output a revised output signal having its high and low voltages at $+V_4$ and $-V_4$ respectively, wherein, $+V_4$ is less than $+V_{ref}$ and $-V_4$ is greater than $-V_{ref}$. As such, it is able to reduce the output signal distortion, and restrict the magnitude of output signal of the audio amplifier circuit, hereby protecting the loudspeaker and human ear from being damaged. It is worth mentioning that, in the amplified output signal, the longer the time interval between the two time points where the output signal intersects the detection voltage upper limit, namely, the longer the time interval between $t_4$ and $t_5$, then the larger the magnitude of the DC voltage level adjustment of the saw-tooth wave signal, thus the lower the voltage gain of the amplifier circuit 26 is reduced. Or alternatively, in the amplified output signal, the longer the time interval between the two time points where the output signal intersects the detection voltage lower limit, namely, the longer the time interval between $t_6$ and $t_7$, then the larger the magnitude of the DC voltage level adjustment of the saw-tooth wave signal, thus the lower the voltage gain of the amplifier circuit 26 is reduced.

Figure 6A:
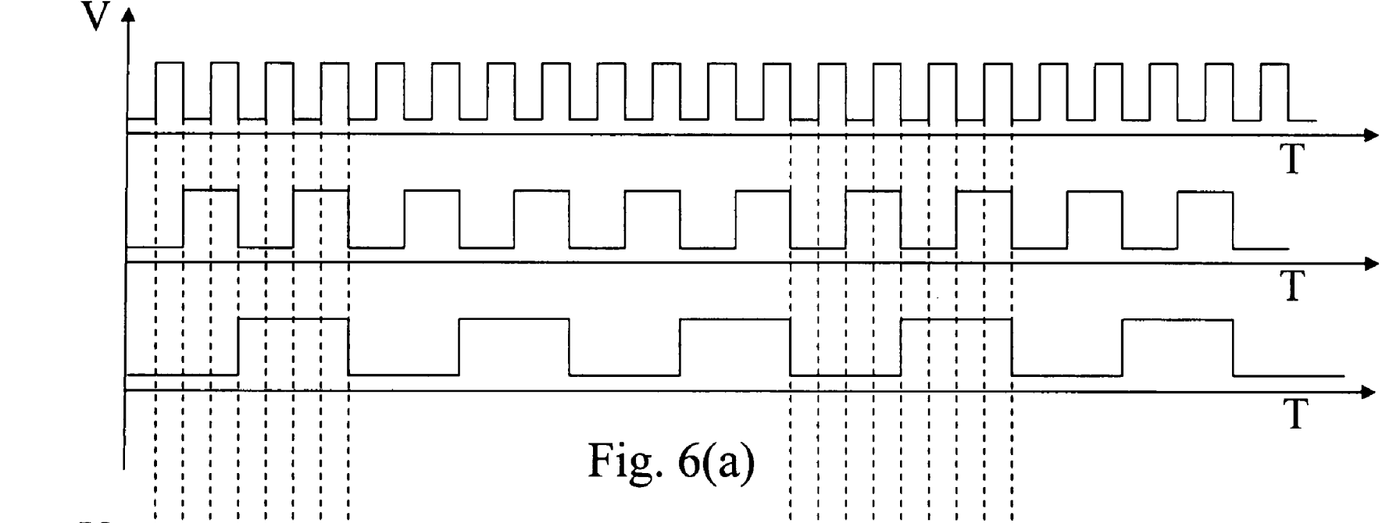
FIGS. 6(a) and 6(b) are the waveform diagrams of output signal of a counter, sound volume control voltage signal and negative slope saw-tooth wave signal according to an embodiment of the present invention.
Figure 6B:
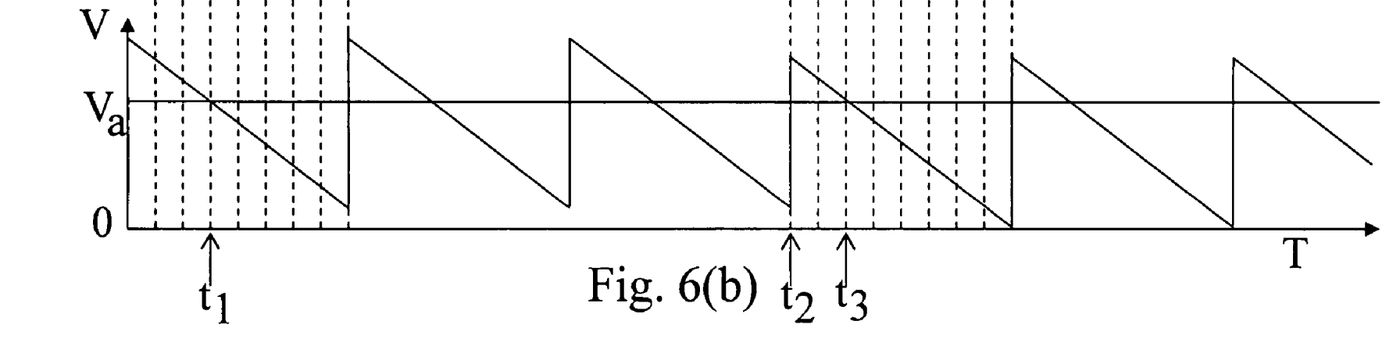

In the following, refer to FIG. 3, FIG. 5, and FIGS. 6(a) to 6(b) simultaneously. Wherein, FIG. 6(a) is a waveform diagram of the output signal of a counter, and FIG. 6(b) is the waveform diagram of sound volume control voltage signal and negative slope saw-tooth wave signal. In the following, another operation of the first embodiment is described, that is similar to the operation mentioned above, and a negative slope saw-tooth wave signal is taken as an example for explanation. As shown in FIG. 6(b), before a time point $t_2$, a sound volume control voltage signal is intersected with a saw-tooth wave signal at a voltage $V_a$, that corresponds to a time point $t_1$ in a first periodic waveform of the saw-tooth wave signal, therefore, at this time, the processor 38 will obtain from the counter 34 a counter value 010, that corresponds to the voltage value $V_a$ of a saw-tooth wave signal and serves as the first counter value and be stored in processor 38 temporarily, thus determining the resistances of resistors 30 and 32, and the initial voltage gain of the amplifier circuit 26.

In other words, before time point $t_2$, an amplifier circuit 26 receives the original input signal having its high and low voltage at $+V_1$ and $-V_1$ respectively, thus the amplifier circuit 26 will output an original output signal according to an initial voltage gain. In this example, the high and low voltages of the original output signal are equal to the detection voltage upper limit $+V_{ref}$ and detection voltage low limit $-V_{ref}$ of the voltage detector 40 respectively.

After time point $t_2$, the original input signal is increased, thus the amplifier circuit 26 receives an increased input signal with its high and low voltage at $+V_2$ and $-V_2$ respectively, wherein, $+V_2$ is greater than $+V_1$, and $-V_2$ is less than $-V_1$. In case that at this time, the initial voltage gain of the amplifier circuit 26 remains unchanged, then the amplifier circuit 26 will output an amplified output signal with its high and low voltages at $+V_3$ and $-V_3$ respectively, wherein, $+V_3$ is greater than $+V_{ref}$, and $-V_3$ is less than $-V_{ref}$. Therefore, voltage detector 40 will output a detection signal to a DC level regulator 42, so as to control a DC level regulator 42 in reducing the DC voltage level of the saw-tooth wave signal.

For the lowered saw-tooth wave signal as viewed from the waveform diagram, the intersected voltage point of a saw-tooth wave signal and a sound volume control voltage signal is located at a higher position of a saw-tooth wave signal. As such, after time point t2, this intersected voltage point corresponds to a time point $t_3$ in the first periodic waveform of the saw-tooth wave signal after the time point $t_2$. Therefore, at this time, the processor 38 will obtain from counter 34 a counter value 001, which corresponds to the voltage value $V_a$ of a saw-tooth wave signal and is less than the first counter value, and that serves as the second counter value in updating the first counter value, hereby reducing the initial voltage gain of the amplifier circuit 26 through varying the resistances of the resistors 30 and 32 by utilizing the second counter value.

Since the voltage gain of the amplifier circuit 26 is reduced, therefore, the amplifier circuit 26 will output an revised output signal with its high and low voltages at $+V_4$ and $-V_4$ respectively, wherein, $+V_4$ is less than $+V_{ref}$, and $-V_4$ is greater than $-V_{ref}$. As such, it is able to reduce the output signal distortion, and restrict the magnitude of output signal of the audio amplifier circuit, hereby protecting the loudspeaker and human ear from being damaged. Similarly, in the amplified output signal, the longer the time interval between the two time points where the output signal intersects the detection voltage upper limit, namely, the longer the time interval between $t_4$ and $t_5$, the larger the magnitude of the DC voltage level adjustment of the saw-tooth wave signal, then the lower the voltage gain of the amplifier circuit 26 is reduced. Or, alternatively, in the amplified output signal, the longer the time interval between the two time points where the output signal intersects the detection voltage lower limit, namely, the longer the time interval between $t_6$ and $t_7$, the larger the magnitude of the DC voltage level adjustment of the saw-tooth wave signal, then the lower the voltage gain of the amplifier circuit 26 is reduced.

Figure 7:
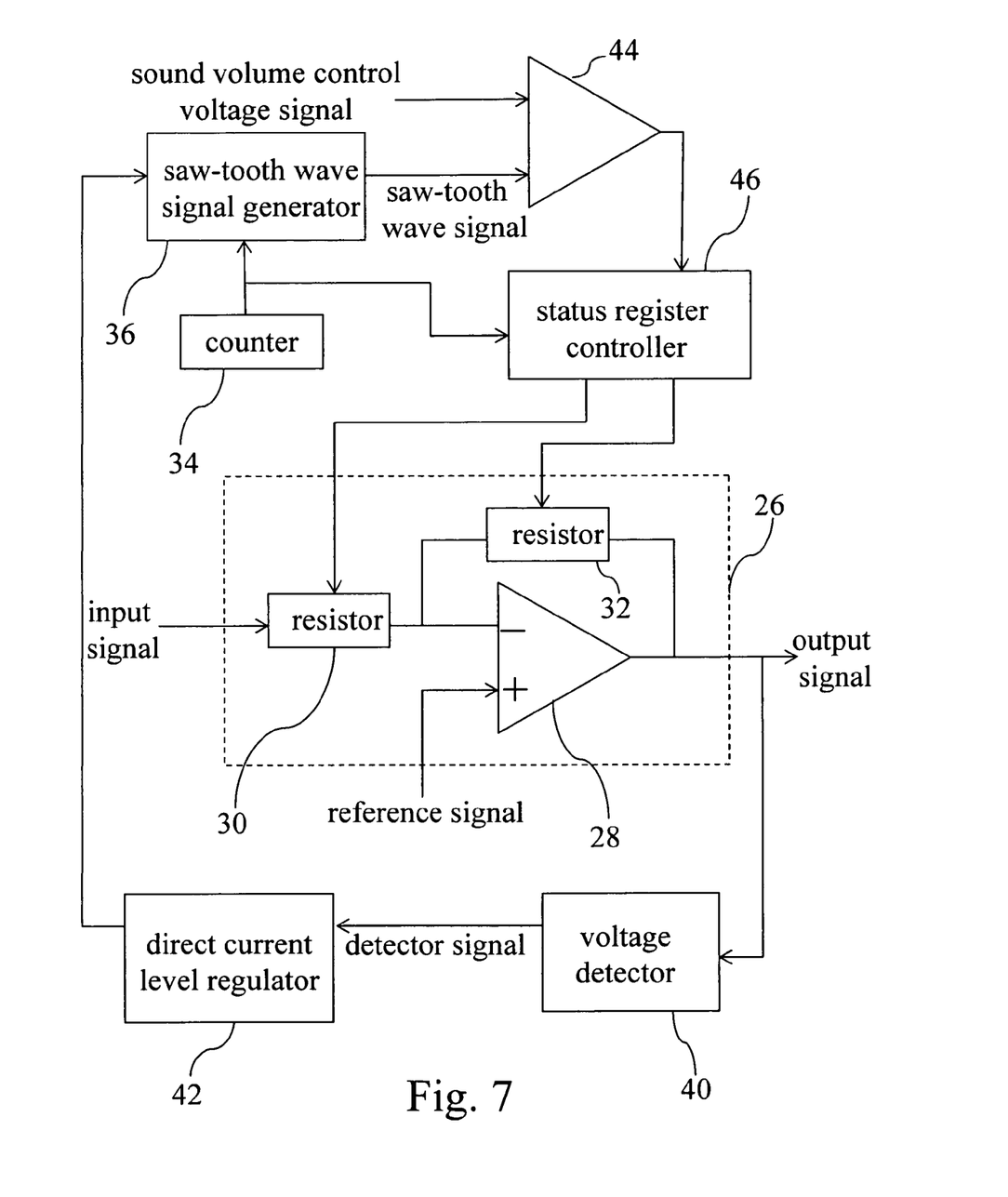
FIG. 7 is a circuit diagram of a gain control circuit according to a second embodiment of the present invention.

In the following, the second embodiment of the present invention will be described. Refer to FIG. 7 for a circuit diagram of a gain control circuit according to a second embodiment of the present invention. As shown in FIG. 7, its difference with the first embodiment is that, in the second embodiment, a comparator 44 and a status register controller 46 are utilized to replace the processor of the first embodiment. The comparator 44 is connected to a saw-tooth wave signal generator 36, and is used to receive a saw-tooth wave signal and a sound volume control voltage signal, and output a first latch-up signal when the sound volume control voltage signal and the saw-tooth wave signal intersect at a voltage V; and output a second latch-up signal, when the DC voltage level of the saw-tooth wave signal has been adjusted and the sound volume control voltage signal and the saw-tooth wave signal intersect at the above-mentioned voltage V. The status register controller 46 is connected to the comparator 44 and the resistors 30 and 32 of the amplifier circuit 26. The status register controller 46 is used to receive the first latch-up signal, and obtain from the counter 34 a counter value corresponding to the voltage V of a saw-tooth wave signal, that serves as the first counter value and is stored in a status register controller 46 temporarily, thus determining the voltage gain of the amplifier circuit 26 through utilizing the first counter value; or, alternatively, the status register controller 46 is used to receive the second latch-up signal, and obtain from the counter 34 a counter value corresponding to the voltage V of a saw-tooth wave signal and is less than the first counter value, that serves as the second counter value in replacing the first counter value, hereby reducing the voltage gain of the amplifier circuit 26 through utilizing the second counter value.

Figure 8A:
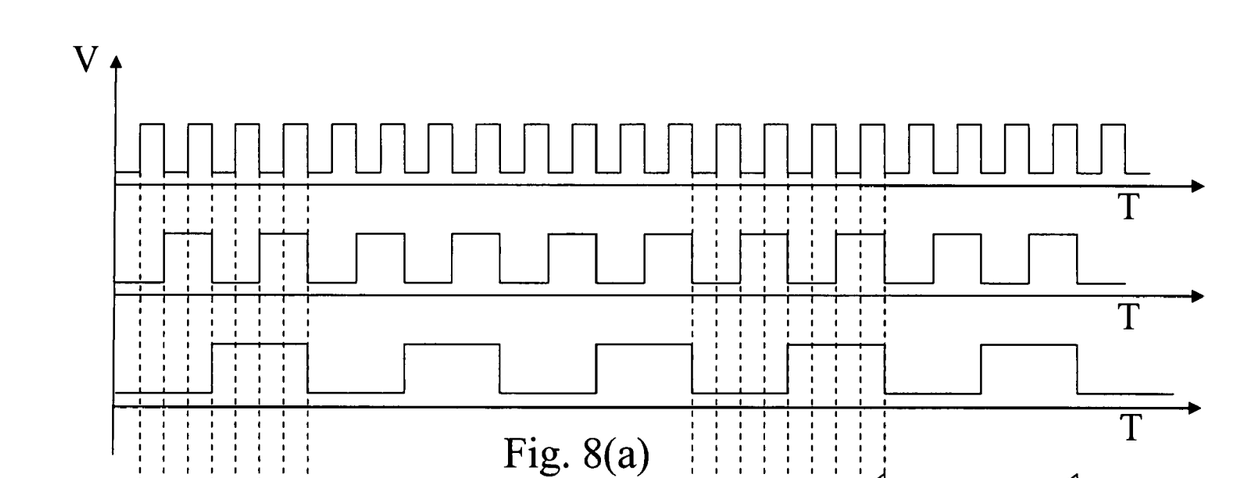
FIGS. 8(a) and 8(c) are the waveform diagrams of output signal of a counter; sound volume control voltage signal and positive slope saw-tooth wave signal, and the corresponding latch-up signal according to an embodiment of the present invention.
Figures 8B, 8C:
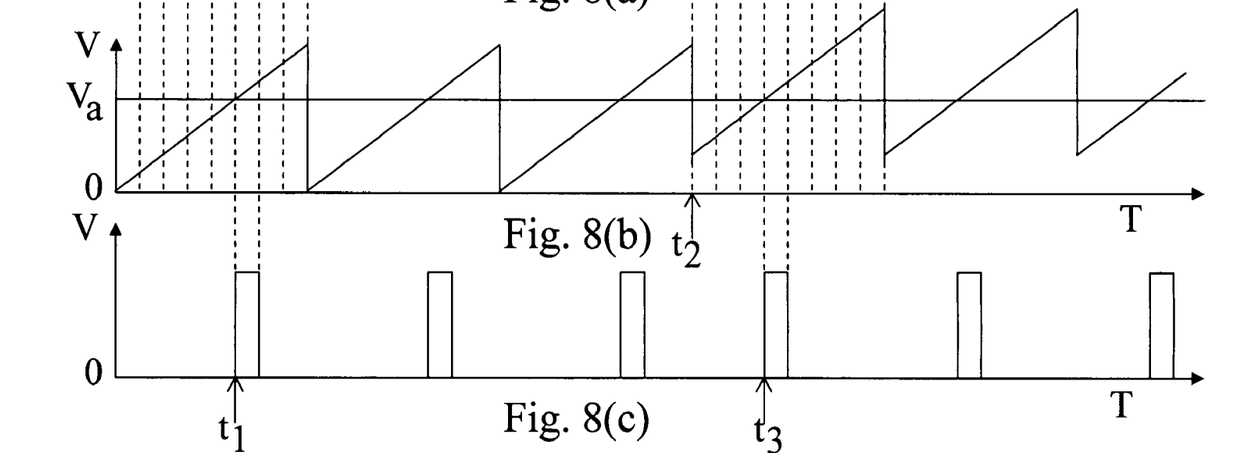

In the following, the second embodiment of the present invention will be described, and a positive slope saw-tooth wave signal is taken as an example for explanation. Refer to FIG. 7, FIGS. 8(a) to 8(c), and FIG. 9 simultaneously. Wherein, FIG. 8(a) is a waveform diagram of output signal of a counter; FIG. 8(b) shows the waveform diagrams of sound volume control voltage signal and positive slope saw-tooth wave signal; and FIG. 8(c) is a waveform diagram of a latch-up signal.

Before a time point $t_2$, a sound volume control voltage signal is intersected with a saw-tooth wave signal at a voltage $V_a$, that corresponds to time point $t_1$ in a first periodic waveform of a saw-tooth wave signal, therefore, at this time point, the comparator 44 will output a first latch-up signal to a status register controller 46, so that the status register controller 46 will obtain from a counter 34 a counter value 100, that corresponds to a voltage $V_a$ of the saw-tooth wave signal, and that serves as the first counter value and is stored in the status register controller 46 temporarily, thus determining the resistances of resistors 30 and 32 and then the initial voltage gain of the amplifier circuit 26. Since in every period of a saw-tooth wave signal, the saw-tooth wave signal and sound volume control voltage signal will intersect once, thus in every period of a saw-tooth wave signal, the operation of determining the voltage gain of an amplifier circuit is performed once. Also, before the time point $t_2$, the counter value corresponding to the intersected voltage point of the saw-tooth wave signal and sound volume control voltage signal is always 100, therefore, the voltage gain of the amplifier circuit 26 remains unchanged.

Figure 9:
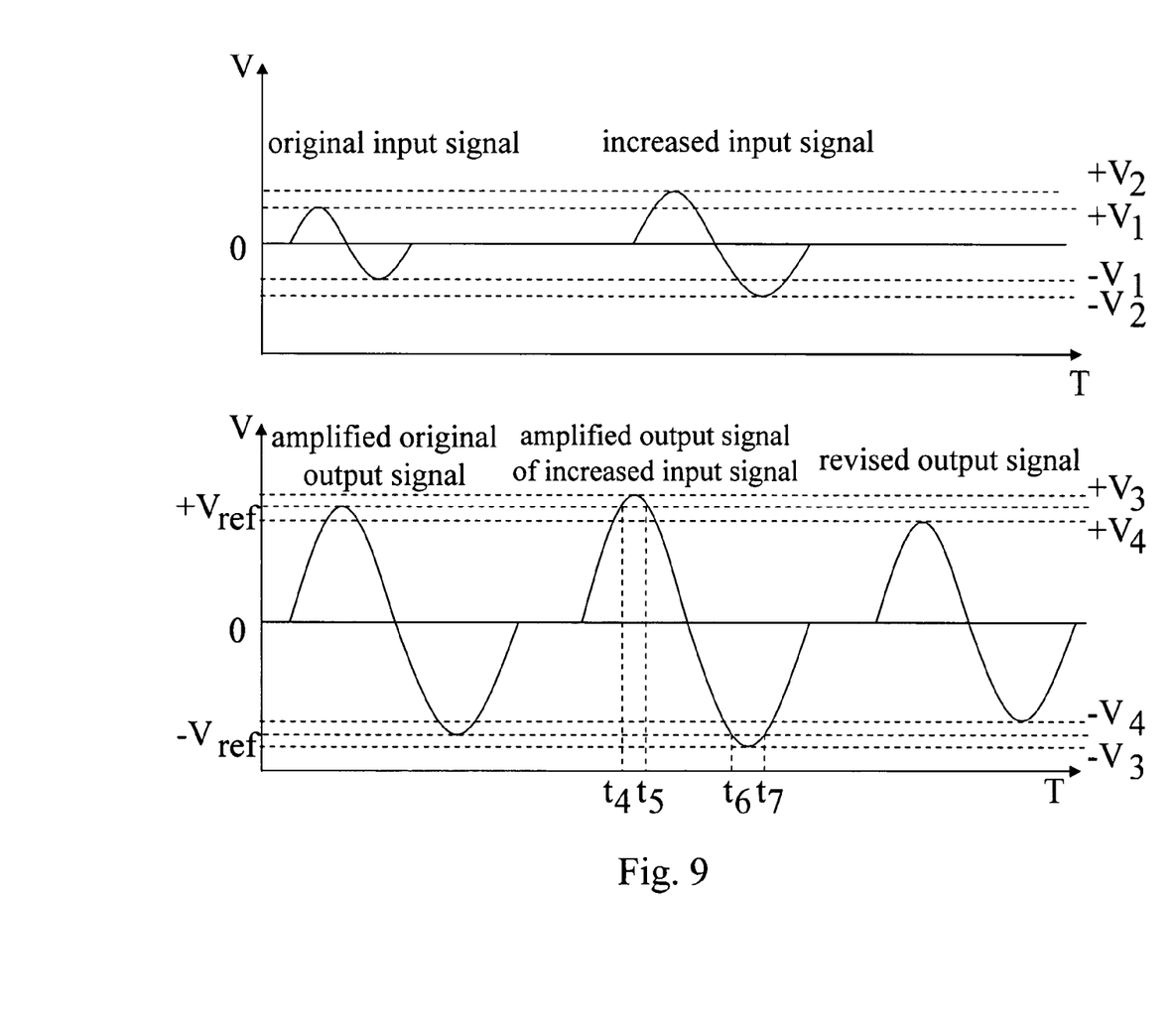
FIG. 9 is a waveform diagram of the input signal and output signal of an amplifier circuit according to a second embodiment of the present invention.

In other words, before time point $t_2$, an amplifier circuit 26 receives an original input signal having its high and low voltages at $+V_1$ and $-V_1$ respectively, thus the amplifier circuit 26 will output an original output signal according to an initial voltage gain. In this example, the high and low voltages of the original output signal are equal to the detection voltage upper limit $+V_{ref}$ and low limit $-V_{ref}$ of the voltage detector 40 respectively.

After time point $t_2$, the original input signal is increased, thus the amplifier circuit 26 receives an increased input signal with its high and low voltages at $+V_2$ and $-V_2$ respectively, wherein, $+V_2$ is greater than $+V_1$, and $-V_2$ is less than $-V_1$. In case that at this time, the initial voltage gain of the amplifier circuit 26 remains unchanged, then the amplifier circuit 26 will output an amplified output signal with its high and low voltages at $+V_3$ and $-V_3$ respectively, wherein, $+V_3$ is greater than $+V_{ref}$, and $-V_3$ is less than $-V_{ref}$. Therefore, voltage detector 40 will output a detection signal to a DC level regulator 42, so as to control the DC level regulator 42 in raising the DC voltage level of a saw-tooth wave signal.

For the raised saw-tooth wave signal as viewed from the waveform diagram, the intersected voltage point of the saw-tooth wave signal and sound volume control voltage signal is located at a lower position of a saw-tooth wave signal. As such, after a time point $t_2$, this intersected voltage point corresponds to a time point $t_3$ in a first periodic waveform of the saw-tooth wave signal after time point $t_2$. Therefore, at this time, the comparator 44 will output a second latch-up signal to a status register controller 46, such that the status register controller 46 will obtain from counter 34 a counter value 010, which corresponds to the voltage value $V_a$ of a saw-tooth wave signal and is less than the first counter value, and that serves as the second counter value in updating the first counter value, hereby reducing the initial voltage gain of the amplifier circuit 26 through varying the resistances of the resistors 30 and 32 by utilizing the second counter value.

Since the voltage gain of the amplifier circuit 26 is reduced, therefore, the amplifier circuit 26 will output an revised output signal with its high and low voltages at $+V_4$ and $-V_4$ respectively, wherein, $+V_4$ is less than $+V_{ref}$, and $-V_4$ is greater than $-V_{ref}$, such that the efficacy achieved by the second embodiment is the same as that of the first embodiment.

In addition, in an amplified output signal, the longer the time interval between the two time points where the output signal intersects the detection voltage upper limit, namely, the longer the time interval between $t_4$ and $t_5$, then the larger the magnitude of the DC voltage level adjustment of the saw-tooth wave signal, thus the lower the voltage gain of the amplifier circuit 26 is reduced. Or alternatively, in an amplified output signal, the longer the time interval between the two time points where the output signal intersects the detection voltage lower limit, namely, the longer the time interval between $t_6$ and $t_7$, then the larger the magnitude of the DC voltage level adjustment of the saw-tooth wave signal, thus the lower the voltage gain of the amplifier circuit 26 is reduced.

Figure 10A:
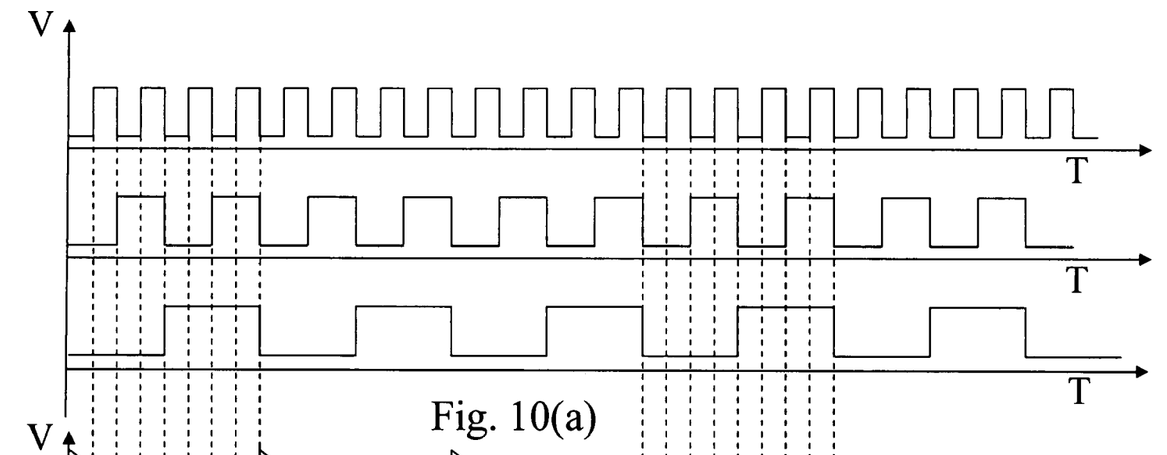
FIGS. 10(a) and 10(c) are the waveform diagrams of output signal of a counter, sound volume control voltage signal and negative slope saw-tooth wave signal, and the corresponding latch-up signal according to an embodiment of the present invention.
Figure 10B:
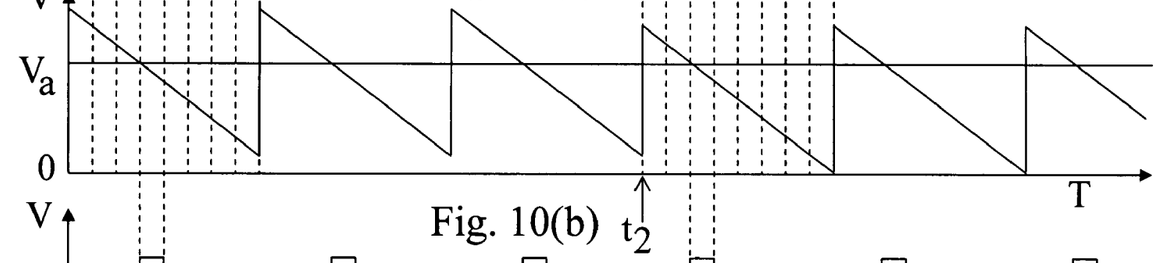
Figure 10C:
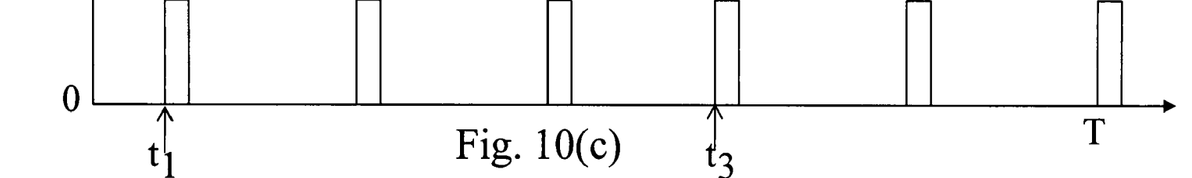

In the following, refer to FIG. 7, FIG. 9, FIGS. 10(a) to 10(c) simultaneously. Wherein, FIG. 10(a) is a waveform diagram of output signal of a counter; FIG. 10 (b) shows the waveform diagrams of sound volume control voltage signal and negative slope saw-tooth wave signal; and FIG. 10 (c) is a waveform diagram of a latch-up signal. In the following, another operation of the second embodiment will be described, which is similar to that of the above-mentioned operation, and a negative slope saw-tooth wave signal is taken as an example for explanation. Before a time point $t_2$, a sound volume control voltage signal is intersected with a saw-tooth wave signal at a voltage $V_a$, that corresponds to time point $t_1$ in a first periodic waveform of the saw-tooth wave signal, therefore, at this time point, the comparator 44 will output a first latch-up signal to a status register controller 46, so that the status register controller 46 will obtain from the counter 34 a counter value 010, that corresponds to a voltage $V_a$ of the saw-tooth wave signal, and that serves as the first counter value and is stored in the status register controller 46 temporarily, thus determining the resistances of resistors 30 and 32 and then the initial voltage gain of the amplifier circuit 26.

In other words, before a time point $t_2$, an amplifier circuit 26 receives the original input signal having its high and low voltages at $+V_1$ and $-V_1$ respectively, such that the amplifier circuit 26 will output an original output signal according to an initial voltage gain. In this example, the high and low voltages of the original output signal are equal to the detection voltage upper limit $+V_{ref}$ and low limit $-V_{ref}$ of the voltage detector 40 respectively.

After the time point $t_2$, the original input signal is increased, thus the amplifier circuit 26 receives an increased input signal with its high and low voltage at $+V_2$ and $-V_2$ respectively, wherein, $+V_2$ is greater than $+V_1$, and $-V_2$ is less than $-V_1$. In case that at this time, the initial voltage gain of the amplifier circuit 26 remains unchanged, then the amplifier circuit 26 will output an amplified output signal with its high and low voltages at $+V_3$ and $-V_3$ respectively, wherein, $+V_3$ is greater than $+V_{ref}$, and $-V_3$ is less than $-V_{ref}$. Therefore, voltage detector 40 will output a detection signal to a DC level regulator 42, so as to control the DC level regulator 42 in reducing the DC voltage level of the saw-tooth wave signal.

For the lowered saw-tooth wave signal as viewed from the waveform diagram, the intersected voltage point of the saw-tooth wave signal and sound volume control voltage signal is located at a higher position of a saw-tooth wave signal. As such, after time point $t_2$, this intersected voltage point corresponds to a time point $t_3$ in the first periodic waveform of a saw-tooth wave signal after a time point $t_2$. Therefore, at this time, the comparator 44 will output a second latch-up signal to a status register controller 46, such that the status register controller 46 will obtain from a counter 34 a counter value 001, which corresponds to the voltage value $V_a$ of a saw-tooth wave signal and is less than the first counter value, and that serves as the second counter value in updating the first counter value, hereby reducing the initial voltage gain of the amplifier circuit 26 through varying the resistances of the resistors 30 and 32 by utilizing the second counter value.

Since the voltage gain of the amplifier circuit 26 is reduced, therefore, the amplifier circuit 26 will output an revised output signal with its high and low voltages at $+V_4$ and $-V_4$ respectively, wherein, $+V_4$ is less than $+V_{ref}$, and $-V_4$ is greater than $-V_{ref}$, as such the efficacy achieved by the second embodiment is the same as that of the first embodiment.

In addition, in an amplified output signal, the longer the time interval between the two time points where the output signal intersects the detection voltage upper limit, namely, the longer the time interval between $t_4$ and $t_5$, then the larger the magnitude of the DC voltage level adjustment of a saw-tooth wave signal, thus the lower the voltage gain of the amplifier circuit 26 is reduced. Or alternatively, in an amplified output signal, the longer the time interval between the two time points where the output signal intersects the detection voltage lower limit, namely, the longer the time interval between $t_6$ and $t_7$, then the larger the magnitude of the DC voltage level adjustment of the saw-tooth wave signal, thus the lower the voltage gain of the amplifier circuit 26 is reduced.

Figure 11:
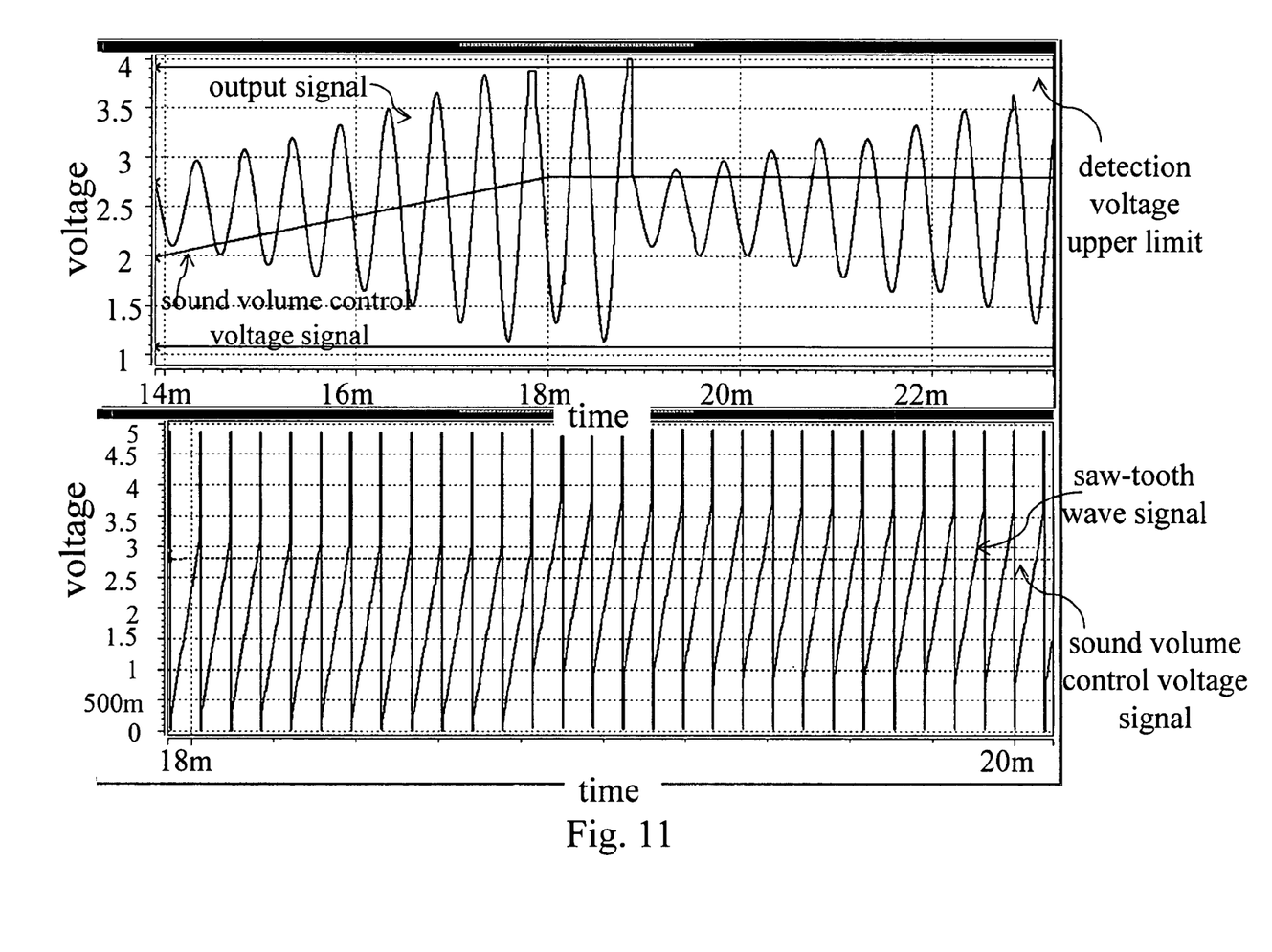
FIG. 11 shows waveform diagrams generated in experiments for sound volume control voltage signal, positive slope saw-tooth wave signal, and output signal of an amplifier circuit according to the present invention.

Finally, refer to FIG. 11 for waveform diagrams generated in an experiment for sound volume control voltage signal, positive slope saw-tooth wave signal, and output signal of an amplifier circuit as described in FIG. 7. As shown in FIG. 11, the upper drawing shows the waveforms of the sound volume control voltage signal and the output signal of an amplifier. Wherein, before 18 ms, the sound volume control voltage signal increases steadily, and the output signal also increases steadily. Before and approaching 18 ms, the output signal has already got close to the detection voltage upper limit, as such, after 18 ms the output signal is decreased slightly. At 18.9 ms, the output signal exceeds the detection voltage upper limit, at this time, the voltage level of the sound volume control voltage signal does not change any more and remains steady, however, the output signal starts to decrease significantly. The lower drawing of FIG. 11 shows waveforms of a sound volume control voltage signal and a saw-tooth wave signal, and the horizontal time axis is an enlargement view of the upper drawing between 18 ms and 20 ms. Wherein, at the time of about 18.2 ms, since the output signal exceeds the detection voltage upper level, therefore, the DC voltage level of the saw-tooth wave signal is raised, such that at about 18.66 ms, the sound volume control voltage signal intersects the saw-tooth wave signal at a voltage corresponding to a lower counter value, thus reducing the voltage gain of an amplifier, and also reducing the amplitude of the output signal. From the lower drawing, it can be known that, after a long period of time, the DC voltage level of the saw-tooth wave signal will return gradually to its original DC voltage level, such that the sound volume control voltage signal intersects the saw-tooth wave signal at a voltage corresponding to a higher counter value, thus the output signal will return gradually to the level of its original amplitude.

Summing up the above, in the present invention, the DC voltage level of a ramp wave signal is adjusted, so as to restrict the magnitude of output signal of an audio amplifier circuit, thus protecting the loudspeaker and human ear from being damaged.

The above detailed description of the preferred embodiment is intended to describe more clearly the characteristics and spirit of the present invention. However; the preferred embodiments disclosed above are not intended to be any restrictions to the scope of the present invention. Conversely, its purpose is to include the various changes and equivalent arrangements which are within the scope of the appended claims.

What is claimed is:

1. A gain control circuit, connected to an amplifier circuit, that is used to output an output signal, comprising:

a counter, used to output a counter value continuously;

a ramp wave signal generator, connected to said counter, and outputs a ramp wave signal according to said counter value;

a processor, connected to said amplifier circuit and said counter, and is used to receive said ramp wave signal and a control voltage signal, and at a voltage of said control voltage signal intersecting said ramp wave signal, obtain from said counter a counter value corresponding to said ramp wave signal as a first counter value and store it temporarily, thus determining a voltage gain of said amplifier circuit by utilizing said first counter value;

a voltage detector, used to preset a detection voltage upper limit and a detection voltage lower limit and receive said output signal, and output a detection signal, when a high voltage of said output signal is greater than said detection voltage upper limit, or a low voltage of said output signal is less than said detection voltage lower limit; and a direct current level regulator, connected to said ramp wave signal generator and said voltage detector, and is used to receive said detection signal and adjust a DC voltage level of said ramp wave signal, such that said processor obtains from said counter said counter value corresponding to said ramp wave signal and less than said first counter value, and that serves as a second counter value to update said first counter value, thereby reducing said voltage gain of said amplifier circuit by utilizing said second counter value.

2. The gain control circuit as claimed in claim 1, wherein said processor further comprising:

a comparator, used to receive said ramp wave signal and said control voltage signal, and at a voltage of said control voltage signal intersecting said ramp wave signal, output a first latch-up signal, and after adjustment of said DC voltage level of said ramp wave signal, and when said control voltage signal intersects said ramp wave signal at said voltage, output a second latch-up signal; and a status register controller, connected to said counter and said amplifier circuit, and when said control voltage signal intersects said ramp wave signal at said voltage, receives said first latch-up signal, such that at said voltage it obtains from said counter said counter value corresponding to said ramp signal as said first counter value and stores it temporarily, thus determining said voltage gain of said amplifier circuit by utilizing said first counter value, or after adjustment of said direct current voltage level of said ramp signal, and when said control voltage signal intersects said ramp wave signal at said voltage, receives said second latch-up signal, and at said voltage obtains from said counter said counter value corresponding to said ramp wave signal and less than said first counter value, and that serves as a second counter value to update said first counter value, thereby reducing said voltage gain of said amplifier circuit by utilizing said second counter value.

3. The gain control circuit as claimed in claim 1, wherein when a slope of said ramp wave signal is positive, said direct current level regulator is used to raise a DC voltage level of said ramp wave signal, thus reducing said voltage gain of said amplifier circuit.

4. The gain control circuit as claimed in claim 1, wherein when said slope of said ramp wave signal is negative, said direct current level regulator is used to lower said DC voltage level of said ramp wave signal, thus reducing said voltage gain of said amplifier circuit.

5. The gain control circuit as claimed in claim 1, wherein when a high voltage of said output signal is greater than said detection voltage upper limit, the longer a time interval between two time points where said output signal intersects said detection voltage upper limit, the larger a magnitude of a DC voltage level adjustment of said ramp wave signal ; when a low voltage of said output signal is less than said detection voltage lower limit, the longer said time interval between said two time points where said output signal intersects said detection voltage lower limit, the larger said magnitude of said DC voltage level adjustment of said ramp wave signal.

6. The gain control circuit as claimed in claim 1, wherein said control voltage signal is an analog signal.

7. The gain control circuit as claimed in claim 1, wherein said ramp wave signal generator is a saw-tooth wave signal generator used to generate a saw-tooth wave signal.

8. The gain control circuit as claimed in claim 1, wherein said amplifier circuit is an audio amplifier, and said control voltage signal is a sound volume control voltage signal.

9. The gain control circuit as claimed in claim 1, wherein said amplifier circuit is used to receive and amplify an input signal, and then output an output signal.

10. A gain control method, that is used to receive an output signal output by an amplifier circuit in controlling a voltage gain of said amplifier circuit, comprising the following steps:

(A) outputting continuously a counter value;

(B) generating a ramp wave signal based on said counter value;

(C) receiving said ramp wave signal and a control voltage signal, and obtaining from a counter said counter value corresponding to said ramp wave signal to serve as a first counter value and storing it temporarily, and determining an initial voltage gain of said amplifier circuit based on said first counter value;

(D) outputting a detection signal, when a high voltage of said output signal is greater than a predetermined detection voltage upper limit, or a low voltage of said output signal is less than a predetermined detection voltage lower limit;

(E) receiving said detection signal, thus adjusting a DC voltage level of said ramp wave signal; and (F) obtaining at said voltage said counter value corresponding to said ramp signal and less than said first counter value, and that serves as a second counter value to update said first counter value, thereby reducing said initial voltage gain of said amplifier circuit by utilizing said second counter value.

11. The gain control method as claimed in claim 10, wherein said step (C) further includes following steps:

receiving said ramp wave signal and said control voltage signal, and outputting a first latch-up signal when said control voltage signal and said ramp wave signal intersects at said voltage; and receiving said first latch-up signal, obtaining at said voltage from a counter said counter value corresponding to said ramp wave signal to serve as said first counter value and storing it temporarily, and determining said initial voltage gain of said amplifier circuit by utilizing said first counter value.

12. The gain control method as claimed in claim 10, wherein said step (F) further includes said following steps:

outputting a second latch-up signal; and receiving said second latch-up signal, obtaining at said voltage from a counter said counter value corresponding to said ramp wave signal and less than said first counter value, and that serves as said second counter value to update said first counter value, thereby reducing said initial voltage gain of said amplifier circuit by utilizing said second counter value.

13. The gain control method as claimed in claim 10, wherein when a slope of said ramp wave signal is positive, then in said step (E), raising a DC voltage level of said ramp wave signal, thereby reducing said initial voltage gain.

14. The gain control method as claimed in claim 10, wherein when said slope of said ramp wave signal is negative, then in said step (E), reducing said DC voltage level of said ramp wave signal, thereby reducing said initial voltage gain.

15. The gain control method as claimed in claim 10, wherein when a high voltage of said output signal is greater than a detection voltage upper limit, the longer a time interval between two time points where said output signal intersects said detection voltage upper limit, the larger a magnitude of a DC voltage level adjustment of said ramp wave signal; when a low voltage of said output signal is less than a detection voltage lower limit, the longer said time interval between said two time points where said output signal intersects said detection voltage lower limit, the larger said magnitude of said DC voltage level adjustment of said ramp wave signal.

16. The gain control method as claimed in claim 10, wherein said control voltage signal is an analog signal.

17. The gain control method as claimed in claim 10, wherein said ramp wave signal is a saw-tooth wave signal.

18. The gain control method as claimed in claim 10, wherein said amplifier circuit is an audio amplifier, and said control voltage signal is a sound volume control voltage signal.

19. The gain control method as claimed in claim 10, wherein said amplifier circuit is used to receive and amplify an input signal, and then output an output signal.

* * * * *